United States Patent
Ott (10) Patent No.: US 10,012,712 B2
(45) Date of Patent: Jul. 3, 2018

(54) METHOD AND MAGNETIC RESONANCE APPARATUS WITH REDUCTION OF AUDIBLE NOISE BY SHORTENING THE ACQUISITION TIME FOR INDIVIDUAL INTERIOR K-SPACE LINES

(71) Applicant: Siemens Aktiengesellschaft, Munich (DE)

(72) Inventor: Martin Ott, Wuerzburg (DE)

(73) Assignee: Siemens Aktiengesellschaft, Munich (DE)

( * ) Notice: Subject to any disclaimer, the term of this patent is extended or adjusted under 35 U.S.C. 154(b) by 523 days.

(21) Appl. No.: 14/678,275

(22) Filed: Apr. 3, 2015

(65) Prior Publication Data

US 2015/0285881 A1    Oct. 8, 2015

(30) Foreign Application Priority Data

Apr. 4, 2014    (DE) .................. 10 2014 206 561

(51) Int. Cl.
| | | |
|---|---|---|
| *G01V 3/00* | (2006.01) | |
| *G01R 33/48* | (2006.01) | |
| *G01R 33/30* | (2006.01) | |
| *G01R 33/34* | (2006.01) | |
| *G01R 33/385* | (2006.01) | |
| *G01R 33/56* | (2006.01) | |
| *G01R 33/561* | (2006.01) | |

(52) U.S. Cl.
CPC ......... *G01R 33/4822* (2013.01); *G01R 33/30* (2013.01); *G01R 33/34092* (2013.01); *G01R 33/3852* (2013.01); *G01R 33/5608* (2013.01); *G01R 33/5617* (2013.01)

(58) Field of Classification Search
CPC ............... G01R 33/30; G01R 33/3852; G01R 33/4804; G01R 33/4822; G01R 33/4833; G01R 33/5608
See application file for complete search history.

(56) References Cited

U.S. PATENT DOCUMENTS

| | | | | |
|---|---|---|---|---|
| 9,274,195 B2* | 3/2016 | Pfeuffer | ............ | G01R 33/4833 |
| 2011/0248714 A1* | 10/2011 | Salomir | ............. | G01R 33/4804 |
| | | | | 324/309 |
| 2014/0300352 A1* | 10/2014 | Li | ...................... | G01R 33/5608 |
| | | | | 324/309 |

OTHER PUBLICATIONS

Conolly et al., "Variable-Rate Selective Excitation", Journal of Magnetic Resonance vol. 78, pp. 440-458 (1988).
Pauly et al., "A k-space analysis of small-tip angle excitation", J. Magn. Reson. vol. 81, pp. 43-56, (1989).
Hennel, "Fast Spin Echo and Fast Gradient Echo MRI With Low Acoustic Noise" Journal of Magnetic Resonance Imaging 13, pp. 960-966, (2001).
Hennel et al., "Silent MRI With Soft Gradient Pulses", Magnetic Resonance in Medicine, No. 42; pp. 6-10 (1999).

(Continued)

*Primary Examiner* — Minh N Tang
(74) *Attorney, Agent, or Firm* — Schiff Hardin LLP (57) ABSTRACT

For each k-space line, a time period is defined that starts with the application of the RF pulse directly prior to the acquisition of the respective k-space line, and ends at the time point of the echo during the acquisition of the MR data of the respective k-space line. This time period is set shorter for those k-space lines that lie in a central region of k-space than for k-space lines that lie outside of the central region.

20 Claims, 9 Drawing Sheets

(56) References Cited

OTHER PUBLICATIONS

Tyler et al., "Magnetic Resonance Imaging With Ultrashort TE (UTE) PULSE Sequences: Technical Considerations", J Magn Reson, No. 25, pp. 279-289; (2007).
Weishaupt et al., "Wie funktioniert MRI", Springer Verlag 2009, pp. 41-48.
Schmitter et al., "Sound pressure level prediction of arbitrary sequences", ISMRM, vol. 112965, (2008).
Jakob et al., "Mixed-bandwidth acquisition: Snr and noise texture," in ISMRM, No. 906, (2001).
Haacke et al., "Magnetic Resonance Imaging—Physical Principles and Sequence Design," pp. 308-315, (1999).
Fransson, "Properties of the phase-alternating phase-shift (Phaps) multiple spin-echo protocol in MRI: a study of the effects of imperfect RF pulses," Magn. Reson., vol. 11, pp. 771-784; (1993).
Feinberg, "VET Imaging: Magnetic Resonance Imaging with Variable Encoding Time," Magnetic Resonance in Medicine, vol. 38, pp. 7-14 (1997).
Constable et al., "Factors influencing in fast spin-echo MR imaging," Magnetic Resonance in Medicine, vol. 10, pp. 497-511, (1992).

\* cited by examiner

METHOD AND MAGNETIC RESONANCE APPARATUS WITH REDUCTION OF AUDIBLE NOISE BY SHORTENING THE ACQUISITION TIME FOR INDIVIDUAL INTERIOR K-SPACE LINES

CROSS-REFERENCE TO RELATED APPLICATIONS

Not applicable.

BACKGROUND OF THE INVENTION

The present invention relates to a method and a magnetic resonance system for acquiring MR data in a volume segment of an examination subject.

DESCRIPTION OF THE PRIOR ART

In order to acquire MR data, magnetic field gradients are switched, among other things. Considerable current intensities occur when the magnetic field gradients are switched. Because the gradient coils by means of which the magnetic field gradients are generated are located within the main magnetic field (B0 field) of the magnetic resonance scanner, this causes a Lorentz force to be generated, which leads to a mechanical excitation of the gradient system of the magnetic resonance system. If there is a rapid change in the magnetic field gradients, and hence a rapid change in the Lorentz forces, this results in strong vibrations of the entire structure of the magnetic resonance scanner. These vibrations can also be transmitted via the ambient air. As a consequence, different levels of loudness exposure are produced, depending on the applied rate of rise or speed of rise (slew rate) of the magnetic field gradients. The loudness generally increases logarithmically with the slew rate of the respective gradient.

BRIEF SUMMARY OF THE INVENTION

Because the loudness generated by a magnetic resonance system is regarded as annoying or even as instilling anxiety by patients who are to be examined, an object of the present invention is to reduce the loudness during the acquisition of MR data in comparison with the prior art.

This object is achieved according to the invention by a method for acquiring MR data in a predetermined volume segment of an examination subject by operation of a magnetic resonance scanner, the method including application of an RF excitation pulse, and acquisition of the MR data by sampling (entering the MR data into) k-space that corresponds to the predetermined volume segment along k-space lines running in parallel, also known as Cartesian sampling.

In accordance with the invention, a time period is defined for each k-space line, this time period beginning during the application of an RF pulse directly prior to the acquisition of the MR data for the respective k-space line, and ending at the time point of the echo that occurs during the acquisition of the MR data of the respective k-space line. This time period is set to a shorter length of time for the acquisition of the MR data of those k-space lines that lie in a central region of k-space than during the acquisition of the MR data of k-space lines that lie outside of the central region of k-space.

The smaller the time gap between the application of the RF pulse and the echo, the less time there is available for switching necessary gradients. Since, according to the invention, the time period is chosen to be comparatively small only during the acquisition of the MR data inside the central region, the problems with regard to the loudness due to the high slew rate of the gradients can advantageously occur only during the acquisition of the MR data inside the central region. In other words, only the central region of k-space is measured "loud", whereas the measurement of the by far larger region of k-space proceeds "quietly".

Since the MR data measured in the central region of k-space substantially determines the contrast of an image that is reconstructed from the acquired MR data, the greater time period for the acquisition of the MR data outside of the central region advantageously has virtually no negative effect on the contrast.

If, for example, the ratio between the central region of the k-space and the rest of k-space equals 1:20, then significantly less than 6% of the acquisition time is to be regarded as "loud". By an appropriate mixing of the k-space lines acquired as "loud" and "quiet" it is possible to decrease the loudness during the acquisition of the MR data significantly on average.

The present invention can be used with spin echo sequences and with gradient echo sequences.

In spin echo sequences, a refocusing pulse is switched prior to the acquisition of the MR data of each k-space line. In this case that refocusing pulse which is applied directly prior to the acquisition of the respective k-space line corresponds to the RF pulse which defines the start of the above-defined time period for the respective k-space line.

In other words, in spin echo sequences, the time gap between the refocusing pulse directly prior to the acquisition of the MR data of a k-space line and the spin echo is shorter according to the invention when that k-space line lies in the central region than when that k-space line lies outside of the central region.

According to the invention, it is possible to dispense with the so-called crusher gradients that are switched before and/or after each refocusing pulse if the MR data of the corresponding k-space lines are acquired twice by means of different refocusing pulses. In this case, the phase cycle of the refocusing pulse for the first measurement of the k-space line is set oppositely to the phase cycle of the refocusing pulse for the second measurement of the same k-space line. Because the MR data of the two measurements of the same k-space line is effectively averaged, sources of interference which are otherwise avoided by means of the crusher gradients are computationally eliminated. Since the twofold measurement of the same k-space line costs time, this variant is as far as possible used only for acquiring the MR data of the k-space lines in the central region of the k-space.

It should be noted that it is also possible according to the invention to switch the crusher gradients even though the same k-space line is acquired twice by means of opposite phase cycles of the refocusing pulses.

The term "opposite phase cycle" means that the phase of the refocusing pulse is equal to 0° (180°) for the first measurement and 180° (0°) for the second measurement.

Since the crusher gradient is among the most time-critical gradients and typically has a high slew rate, the omission of the crusher gradients advantageously eliminates a further source of high loudness generation.

According to the invention it is also possible, starting from the same RF excitation pulse, to acquire multiple k-space lines in one echo train by applying a respective refocusing pulse for each k-space line. In this case an interval called an echo spacing between two refocusing pulses adjacent in time for the same echo train is constant.

In this embodiment variant, the echo spacing is chosen to be shorter in time if k-space lines that lie in the central region of the k-space are contained in the echo train than when this is not the case.

To put it another way, according to this embodiment variant a distinction is made between two different types of echo trains. With the first type, a plurality of k-space lines are acquired, at least one of said k-space lines lying inside the central region. With the second type, multiple k-space lines are likewise acquired, although none of these k-space lines lies inside the central region. The time period or, as the case may be, the echo spacing is set shorter or smaller for the first type than for the second type. In this case, in particular with the echo trains of the first type, the loud crusher gradients can be dispensed with by measuring the respective k-space lines twice, as described in the foregoing.

In the case of gradient echo sequences, a dephasing gradient is switched, followed by a rephasing gradient, prior to the acquisition of the MR data of each k-space line. In a gradient echo sequence, the RF excitation pulse corresponds to the RF pulse which defines the start of the time period.

In other words, according to the invention, the time gap between the RF excitation pulse and the echo, i.e. the echo time, is shorter for a k-space line in the case of gradient echo sequences when that k-space line lies in the central region than when that k-space line lies outside of the central region.

During the acquisition of the MR data of a k-space line that lies in the central region of the k-space, the RF excitation pulse can be a half pulse in order to enable a dephasing gradient to be switched as quickly as possible. In this case two measurements are carried out in order to acquire the MR data of the same k-space line. A slice selection gradient that is used for the first measurement of the respective k-space line has, in comparison with the slice selection gradient that is used for the second measurement of the same k-space line, the same absolute value but a different sign.

Since half pulses are at their maximum at the end of their time interval, only a very small dephasing moment needs to be applied in the slice selection direction, which moment can be generated non-time-critically and quietly before the commencement of the acquisition of the MR data. Although the measurement time for the k-space lines inside the central region is doubled, the central region accounts for only a small percentage (e.g. 6%) of the entirety of k-space, so there is scarcely any increase in the measurement time for k-space as a whole.

It is also possible to set the half pulse and the slice selection gradient in such a way that virtually no dephasing occurs due to the slice selection gradient, with the result that a subsequent rephasing in the slice selection direction can advantageously be dispensed with.

In this embodiment variant, a slice selection gradient is used whose magnitude changes during the time in which the half pulse is being applied. As a result the slice selection gradient can already be ramped down while the half pulse is still active.

According to an inventive embodiment variant, the k-space lines that lie in the central region of the k-space are only acquired incompletely. To that end, the dephasing gradient is switched only sufficiently briefly so that only a predetermined number of k-space points are acquired prior to the respective gradient echo of the respective k-space line. Said predetermined number is in this case significantly less than half the number of k-space points sampled in a completely acquired k-space line.

As a result of the incomplete acquisition of the respective k-space lines in the central region, which is parameterizable by the appropriate choice of the predetermined number of k-space points, a short echo time can also be achieved using dephasing and rephasing gradient moments that are small compared to the prior art.

It should be noted that owing to the symmetry of k-space, it is sufficient theoretically to acquire only half of the k-space points per k-space line. In practice, however, somewhat more k-space points are required, for which reason the predetermined number of k-space points are sampled prior to the gradient echo.

The predetermined number of k-space points acquired prior to the respective gradient echo is in this case constant in particular for all k-space lines lying inside the central region of k-space.

This predetermined number can amount to 15 pixels, for example, when a completely acquired k-space line comprises 256 pixels. Since the number of k-space points acquired after the gradient echo is the same for all k-space lines (irrespective of whether they are inside or outside of the central region), the number of acquired k-space points is the same for the k-space lines inside the central region (and amounts e.g. to (128+15) 143 pixels).

According to a preferred embodiment, a first time interval in which the dephasing gradient is switched is chosen to be only as long as a second time interval in which a phase encoding gradient is switched.

For the Cartesian sampling of k-space, a phase encoding gradient is switched after the RF excitation. The second time interval (i.e. for how long the phase encoding gradient is switched) is in this case substantially dependent on the distance of the k-space line that is to be acquired from the k-space center. Since the first time interval in which the dephasing gradient is switched is set equal to the second time interval in which the phase encoding gradient is switched, the echo time is advantageously not extended as a result of the switching of the dephasing gradient. In this embodiment, all the more k-space points of a k-space line are accordingly acquired, the farther away the k-space line is located from the k-space center.

In a three-dimensional acquisition of the k-space, two phase encoding gradients are usually switched. In this case the second time interval is defined by that of the two phase encoding gradients which is switched for a longer length of time for the phase encoding of the respective k-space line.

Since the first time interval in which the dephasing gradient is switched is all the greater or longer, the further away the k-space line is located from the k-space center, the echo time also increases proportionally. In this case the echo time increases constantly as the distance from the k-space center becomes greater, as a result of which image artifacts can be avoided in the reconstructed image.

The longer echo time for the k-space lines at the periphery of k-space only marginally degrades the image contrast in MR images reconstructed from the acquired MR data, since the image contrast is substantially determined by the echo time for the k-space lines in the central region.

The non-acquired MR data can be reconstructed retroactively. In order to achieve a stable image phase, significantly more than half of the MR data of k-space should be acquired, which is the case according to the invention, since more than 50% of the MR data is acquired in the central region and 100% of the MR data is acquired at the periphery of k-space. This stable image phase is important for a successful reconstruction of the non-acquired MR data.

As a result of the incomplete acquisition of the k-space lines it is possible, in spite of a small echo time for the k-space lines in the central region of k-space, to select a low bandwidth (e.g. 200 Hz/px) for the acquisition of the MR data of these k-space lines.

Owing to the low bandwidth, the amplitude of the readout gradient and above all the slew rate of the readout gradient can be kept low. The low bandwidth advantageously leads to a high signal-to-noise ratio.

Preferably, the repetition time TR is set to constant for all the k-space lines.

Since the k-space lines in the central region of the k-space are acquired incompletely, the repetition time for these k-space lines could be set smaller or shorter than the repetition time for k-space lines located at the periphery of k-space. However, in order to keep the steady state of the magnetization as constant as possible throughout the entire measurement (i.e. the acquisition of all k-space lines), the same repetition time is chosen for all of the k-space lines.

An asymmetric pulse is used for the RF excitation pulse, in particular for the acquisition of the MR data outside of the central region.

An asymmetric pulse in this context is a pulse that has its maximum value shortly before the end of the time interval in which the asymmetric pulse is applied for the excitation. A shorter echo time can be achieved using asymmetric pulses as compared to symmetric pulses, without the MR data of the respective k-space line having to be acquired twice.

According to the present invention, the MR data can be acquired one slice at a time (i.e. two-dimensionally) or three-dimensionally.

It should be pointed out that even in the case of a three-dimensional acquisition of the MR data it is possible to operate with a kind of slice selection gradient in order to excite the volume segment (for example along 60 mm). Since in this case the amplitudes of the slice selection gradient are very low, the gradient moment that is to be rephased in the slice selection direction also turns out correspondingly small, such that the necessary rephasing can be completed within the time period required for the phase encoding. Half pulses can therefore be dispensed with in general in a three-dimensional acquisition of the MR data.

Furthermore, parallel imaging can be used in order to acquire the MR data concurrently by means of a plurality of RF receive antennas.

With parallel imaging, the measurement time is advantageously reduced by a factor N (number of RF receive antennas used).

The slew rate of all of the gradients can be set during the acquisition of the MR data so that the slew rate corresponds at a maximum to a predetermined percentage (e.g. 20%, more preferably 10%, and most preferably 5%) of the maximum slew rate that is possible for the magnetic resonance system for the corresponding gradient.

In other words, the slew rate of each gradient during the entire measurement corresponds at most to the predetermined percentage of the maximum possible slew rate. Even short violations exceeding this percentage limit are not tolerated in this case. As a result, the loudness generated by the magnetic resonance system can advantageously be reduced significantly in comparison with the prior art.

In order to establish the predetermined percentage for a specific magnetic resonance system, the loudness can also be measured in advance in each case for specific slew rates of the respective gradient. Since the loudness increases with increasing slew rate, the predetermined percentage of the maximum possible slew rate can be determined as that percentage of the maximum slew rate of the respective gradient at which the loudness that results at said percentage of the maximum slew rate lies just below or at least not higher than a predetermined loudness threshold value.

A magnetic resonance system for acquiring MR data in a predetermined volume segment in an examination subject is also provided within the scope of the present invention. The magnetic resonance system has a scanner into which a basic field magnet and a gradient field system are built, and at least one RF antenna, and a control computer that operates the gradient field system and the at least one RF antenna, for receiving measurement signals picked up by the RF antenna or antennas and for evaluating the measurement signals, and for generating the MR images. The magnetic resonance scanner is operated by the control computer so that the RF excitation pulse is radiated by the at least one RF antenna and the MR data are detected and entered along parallel-running k-space lines (Cartesian trajectory). The control computer defines a time period for filling each k-space line with MR data, which time period starts, during the application of an RF pulse, directly prior to the acquisition of the respective k-space line and ends at a time point of the echo during the acquisition of the MR data of the corresponding k-space line. The control computer sets the time period to a shorter length for those k-space lines that lie in a central region of k-space than for k-space lines that lie outside of that central region.

The advantages of the magnetic resonance system according to the invention substantially correspond to the advantages of the method according to the invention, as explained above.

The present invention encompasses a non-transitory, computer-readable data storage medium encoded with programming instructions that can be loaded into a memory of a programmable controller or of a computer of a magnetic resonance system. All or some of the above-described embodiments of the method according to the invention can be performed by when the controller or computer executes the programming instructions. For this purpose the computer program product may require program means, e.g. libraries and help functions, in order to realize the corresponding embodiment variants of the methods. The software (programming instructions) can be a source code (e.g. C++) which still needs to be compiled (assembled) and linked or which only needs to be interpreted, or it can be an executable software code which only requires to be loaded into the corresponding computing unit or control device in order to execute.

The electronically readable data storage medium can be, for example, a DVD, a magnetic tape or a USB stick, on which electronically readable control information, in particular software, is stored.

The present invention enables a significant reduction in the loudness of a magnetic resonance system in spite of short echo times and in spite of small slice thicknesses. Furthermore, the invention can be used generally during the acquisition of MR data by means of a magnetic resonance system in order to perform at least a major part of the measurement (acquisition of the MR data) quietly in comparison with the prior art.

DESCRIPTION OF THE PREFERRED EMBODIMENTS

Figure 1:
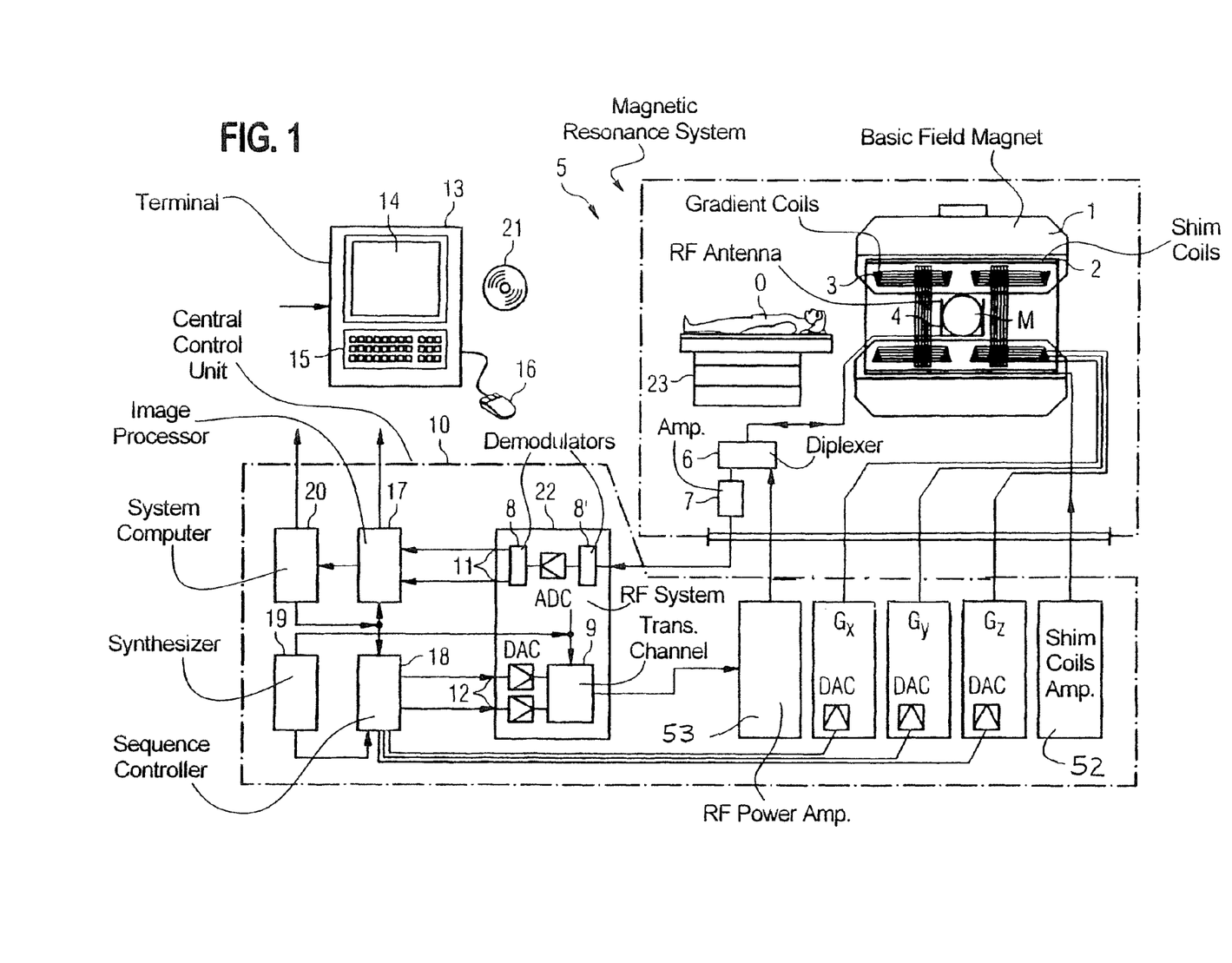
FIG. 1 schematically illustrates a magnetic resonance system according to the invention.

FIG. 1 schematically illustrates a magnetic resonance scanner 5 (of a magnetic resonance imaging or nuclear spin tomography apparatus). In this case a basic field magnet 1 generates a strong magnetic field that is constant with respect to time in order to polarize or align the nuclear spins in an examination region of an object O, such as e.g. a part of a human body that is to be examined, which is arranged lying on a table 23 in the magnetic resonance system 5. The high degree of homogeneity of the basic magnetic field that is required for the nuclear spin resonance measurement is defined in a typically spherical measurement volume M in which the parts of the human body that are to be examined are arranged. In order to support the homogeneity requirements and in particular to eliminate time-invariable influences, elements called shim plates made of ferromagnetic material are mounted at suitable points. Time-variable influences are eliminated by shim coils 2 that are supplied with current by a shim coils amplifier 52.

A cylinder-shaped gradient field system or gradient system 3 composed of three sub-windings is inserted into the basic field magnet 1. The sub-windings are supplied with electric current by respective amplifiers for the purpose of generating a linear (also time-variable) gradient field in the respective direction of the Cartesian coordinate system. In this case the first sub-winding of the gradient field system 3 generates a gradient $G_x$ in the x-direction, the second sub-winding generates a gradient $G_y$ in the y-direction, and the third sub-winding generates a gradient $G_z$ in the z-direction. Each amplifier has a digital-to-analog converter which is driven by a sequence controller 18 for generating gradient pulses at the correct times.

Located within the gradient field system 3 are one or more radiofrequency antennas 4 which convert the radiofrequency pulses emitted by a radiofrequency power amplifier 53 into an alternating magnetic field for exciting the nuclei and aligning the nuclear spins of the object O that is to be examined or of the region of the object O that is to be examined. Each radiofrequency antenna 4 is composed of one or more RF transmit coils and one or more RF receive coils in the form of a ring-shaped, preferably linear or matrix-like, arrangement of component coils. The alternating field emanating from the precessing nuclear spins, i.e. usually the nuclear spin echo signals induced by a pulse sequence composed of one or more radiofrequency pulses and one or more gradient pulses, is also converted by the RF receive coils of the respective radiofrequency antenna 4 into a voltage (measurement signal) which is supplied via an amplifier 7 to a radiofrequency receive channel 8 of a radiofrequency system 22. The radiofrequency system 22, which is part of a control device 10 of the magnetic resonance system 5, additionally has a transmit channel 9 in which the radiofrequency pulses for exciting the magnetic nuclear resonance are generated. In this case the respective radiofrequency pulses are represented digitally as a sequence of complex numbers on account of a pulse sequence predefined by the system computer 20 in the sequence controller 18. This number sequence is supplied in the form of a real and an imaginary part via respective inputs 12 to a digital-to-analog converter in the radiofrequency system 22, and from the latter to a transmit channel 9. In the transmit channel 9, the pulse sequences are modulated onto a radiofrequency carrier signal, the fundamental frequency of which corresponds to the resonance frequency of the nuclear spins in the measurement volume.

Switching between transmit and receive mode is accomplished by way of a transmit-receive diplexer 6. The RF transmit coils of the radiofrequency antenna(s) 4 radiate the radiofrequency pulses for exciting the nuclear spins into the measurement volume M and resulting echo signals are sampled by way of the RF receive coil(s). The correspondingly obtained nuclear resonance signals are demodulated in the first demodulator 8' of the receive channel of the radiofrequency system 22 in a phase-sensitive manner to an intermediate frequency, digitized in the analog-to-digital converter (ADC), and output via the output 11. This signal is also demodulated to the frequency 0. The demodulation to the frequency 0 and the separation into real and imaginary part take place after the digitization in the digital domain in a second demodulator 8. An MR image is reconstructed by means of an image computer 17 from the measurement data obtained in said way via an output 11. The management of the measurement data, the image data and the control programs is handled by way of the system computer 20. Based on specifications by means of control programs, the sequence controller 18 controls the generation of the pulse sequences desired in each case and the corresponding sampling of the k-space. In particular, the sequence controller 18 in this case controls the switching of the gradients at the correct time, the transmission of the radiofrequency pulses at the defined phase amplitude, and the reception of the nuclear resonance signals. The time base for the radiofrequency system 22 and the sequence controller 18 is provided by a synthesizer 19. Corresponding control programs for generating an MR image, which are stored e.g. on a DVD 21, are selected and the generated MR image is displayed at a terminal 13 which comprises a keyboard 15, a mouse 16 and a screen 14.

Figure 2:
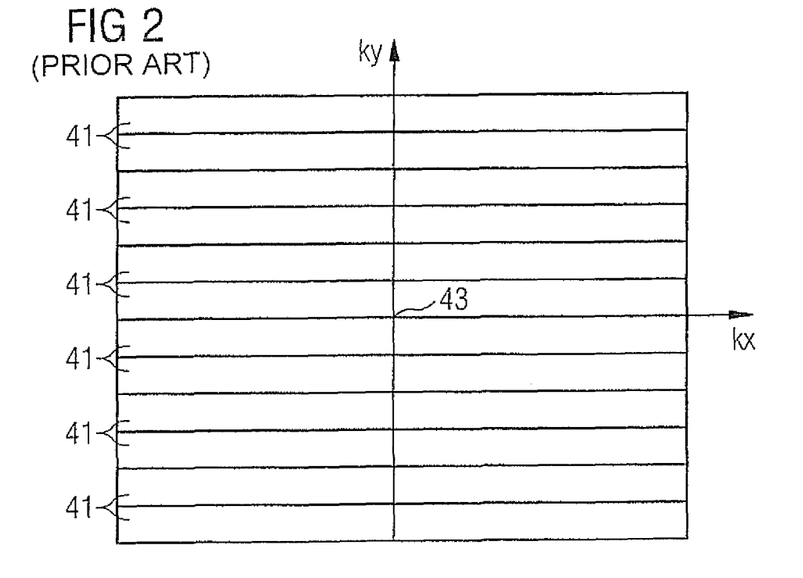
FIG. 2 shows for comparison, how the k-space lines are conventionally acquired.

FIG. 2 shows how the k-space lines 41 are acquired in the case of a turbo spin-echo sequence according to the prior art. In this case an echo train begins with the k-space line in the vicinity of the k-space center 43, k-space lines 41 located further away from the k-space center 43 being acquired subsequently. In this case the echo spacing, i.e. the time gap between two succeeding refocusing pulses, is constant for all of the k-space lines 41.

Figure 3:
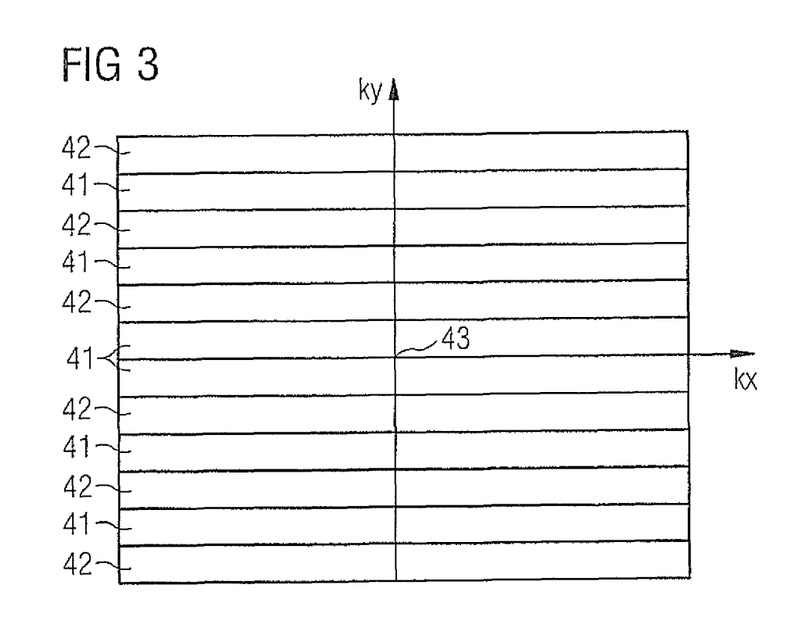
FIG. 3 shows how the k-space lines are acquired according to the invention.

In contrast thereto, FIG. 3 shows how the k-space lines 41, 42 are acquired by a turbo spin-echo sequence according to the invention. In this case the first echo train begins with the k-space line 41 which adjoins the k-space center 43 above the k-space center 43 in FIG. 3. In this first echo train, the k-space lines 41 lying higher up in FIG. 3 are then acquired subsequently. The second echo train begins with the k-space line 41 which adjoins the k-space center 43 below the k-space center 43 in FIG. 3. In this second echo train, the k-space lines 41 lying lower down in FIG. 3 are then acquired subsequently. The third echo train begins with the k-space line 42 that lies directly above the first k-space line 41 of the first echo train, and continues with the k-space lines 42 lying higher up. The fourth echo train begins with the k-space line 42 that lies directly below the first k-space line 41 of the second echo train, and continues with the k-space lines 42 lying lower down.

In this example the echo spacing in the case of the first and second echo train equals 8.5 ms, while the echo spacing for the third and fourth echo train amounts to 12 ms. If the central region of k-space is defined as those two k-space lines 41 which adjoin the k-space center 43 above and below, the k-space lines 41 in the central region of the k-space are acquired using a shorter echo spacing than k-space lines 42 outside of the central region.

Generally, the shorter echo spacing used for echo trains which at least partially acquire MR data in the central region of the k-space is chosen as a function of the required contrast. The longer echo spacing for the echo trains which acquire MR data exclusively outside of the central region, is chosen such that the required contrast can be achieved, yet nonetheless a comparatively low loudness of the magnetic resonance system is present during the acquisition of the MR data.

It can be seen from the embodiment illustrated in FIG. 3 that, according to the invention, not all of the k-space lines lying outside of the central region are acquired using a greater or longer echo spacing than the k-space lines 41 lying inside the central region.

Because of the longer echo spacing, the k-space lines 42 can be acquired by means of quiet gradient switching, since sufficient time is available to switch the gradients quietly. In order to enable the k-space lines 41 for which the echo spacing is shorter to be switched quietly also, the MR data of each k-space line 41 can be acquired twice, for example, in which case the two refocusing pulses used have opposite phase cycles to one another in order to thereby dispense with the crusher gradients. As a result, ultimately more time for switching the gradients is obtained.

Figure 4:
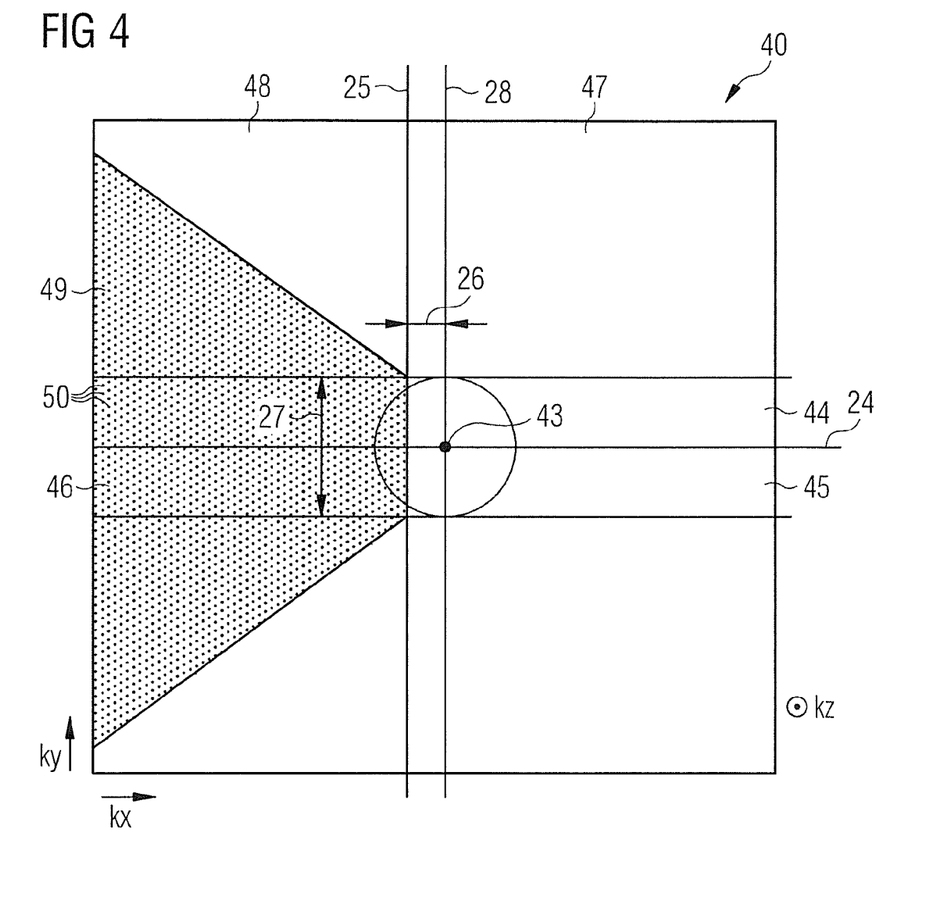
FIG. 4 shows how the k-space is sampled according to the invention in the case of a gradient echo sequence.

FIG. 4 schematically illustrates how k-space 40 is acquired using k-space lines running parallel in the kx-direction (readout direction). In this case, k-space 40 is subdivided by the plane 25 standing perpendicularly to the readout direction into two sections 47, 48. K-space 40 also is subdivided into a central region 44 and a non-central region (without reference sign). The plane 25 is in this case separated from the k-space center 43 by a distance 26 corresponding to a predetermined number of k-space points (15 pixels, for example). The central region 44 is embodied symmetrically with respect to a straight line 24 running through the k-space center 43 in the readout direction kx and has a dimension 27 in the direction ky which likewise corresponds to a further number of k-space points or k-space lines (e.g. 15 pixels).

Similarly to the k-space 40, the central region 44 is subdivided into two sections 45, 46 by the plane 25. During the acquisition of the MR data of the k-space lines lying in the central region 44, only those k-space points are acquired that lie inside the section 45, while the k-space points 50 lying in the section 46 are not acquired. In a similar manner, the k-space points 50 lying in the k-space section 49 are not acquired during the acquisition of the MR data of the k-space lines lying outside of the central region 44.

The way that k-space 40 is now sampled with the use of a gradient echo sequence according to the invention, is explained with reference to FIG. 5.

In order to sample a k-space line, an RF excitation pulse 31 is first applied (radiated) in the form of a half pulse, while at the same time a slice selection gradient 32 is switched. Since the half pulse 31 is at its maximum at the end of the pulse, only a very small dephasing moment must advantageously be switched in the slice selection direction kz, which moment can be switched without problems within the echo time TE. The RF excitation pulse 31 is directly followed by the switching of a phase encoding gradient 34 and the switching of a dephasing gradient 38 in the readout direction kx. The readout gradient 33 is switched directly after the dephasing gradient 38. The measurement time TS (i.e. the acquisition of the MR data of the respective k-space line) starts after the readout gradient 33 has reached its maximum value.

The gradient echo occurs as soon as the gradient moment generated by the readout gradient 33 corresponds to the gradient moment generated by the dephasing gradient 38. The time period from the start of the dephasing gradient 38 to the echo is referred to as the echo time TE. The time point of the gradient echo or, as the case may be, the end of the echo time TE corresponds to the straight line 28 that runs through the k-space center 43 perpendicularly to the readout direction kx in FIG. 4. The start of the measurement of the k-space lines in the central region 44 corresponds to the plane 25 in FIG. 4. Stated differently, a k-space point of the plane 25 is acquired at the start of the measurement time TS, while a k-space point of the straight line 28 is acquired at the time point of the gradient echo.

Since the dephasing gradient 38 for the k-space lines in the central region 44 is switched only briefly in order to generate a short echo time TE, only a few k-space points are acquired before the gradient echo, as represented by the short distance 26.

Figure 5:
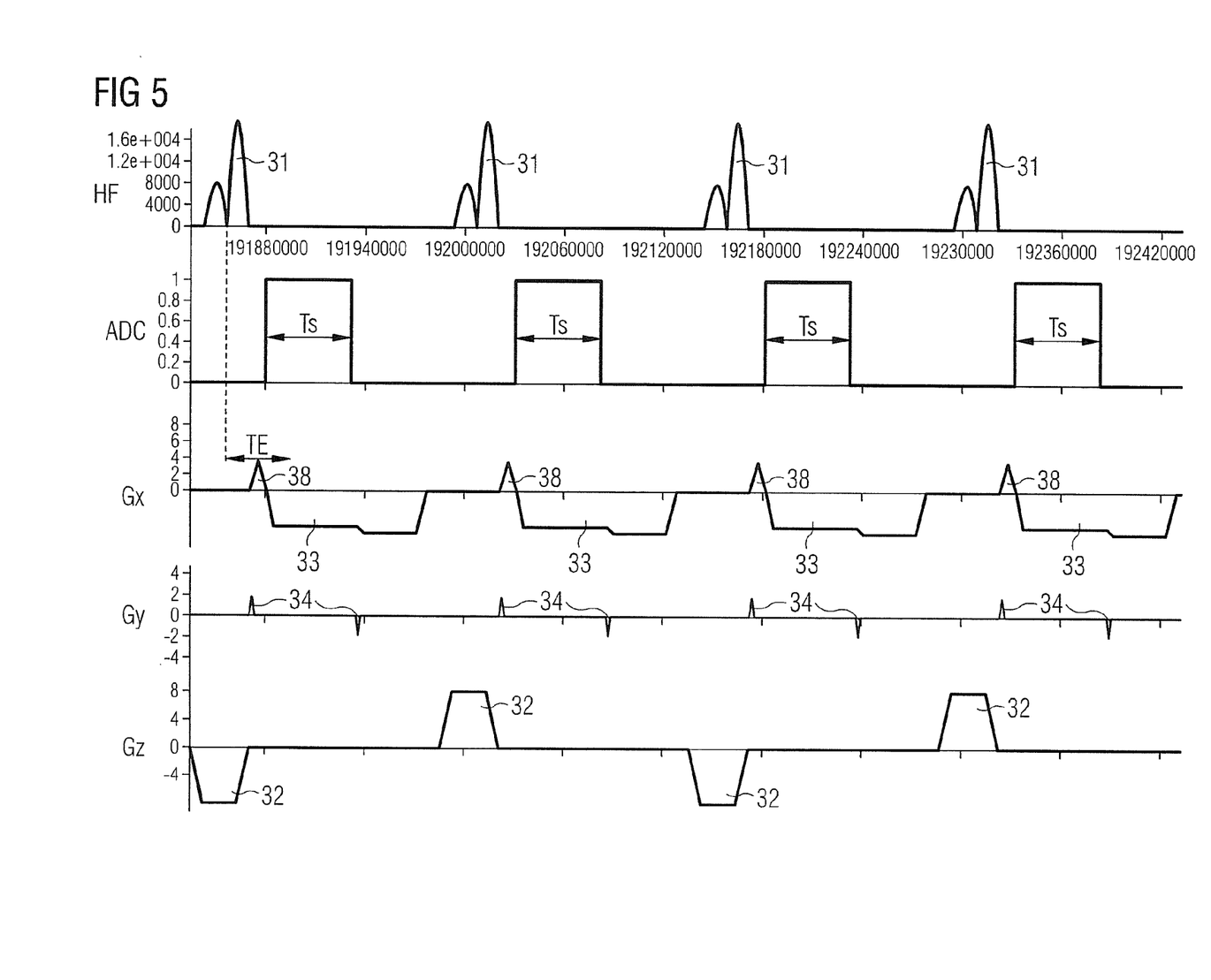
FIG. 5 shows a two-dimensional gradient echo sequence according to the invention using half pulses.

Since half pulses 31 are used for the measurement of the k-space lines lying inside the central region 44, the measurement of the same k-space line must be repeated with oppositely switched slice selection gradient 32, as is shown in FIG. 5.

In the case of k-space lines outside of the central region 44, the gradient moment that is to be generated by the phase encoding gradient 34 before the measurement time $T_S$ must be all the greater, the further away the respective k-space line is located from the k-space center 43. Because the phase encoding gradient 34 must be switched all the longer, the greater the gradient moment that is to be generated, the dephasing gradient 38 can also be switched correspondingly longer. This causes the starting point of the respective k-space line in FIG. 4 to travel further to the left, the greater the distance of the k-space line is from the k-space center 43. For this reason, the k-space section 49, which includes the non-acquired k-space points 50, has the triangular profile depicted.

In summary, the k-space points contained in the k-space section 47 are acquired for each k-space line, while the k-space points lying in the k-space section 48 are acquired only for the region outside of the k-space section 49.

Figure 6:
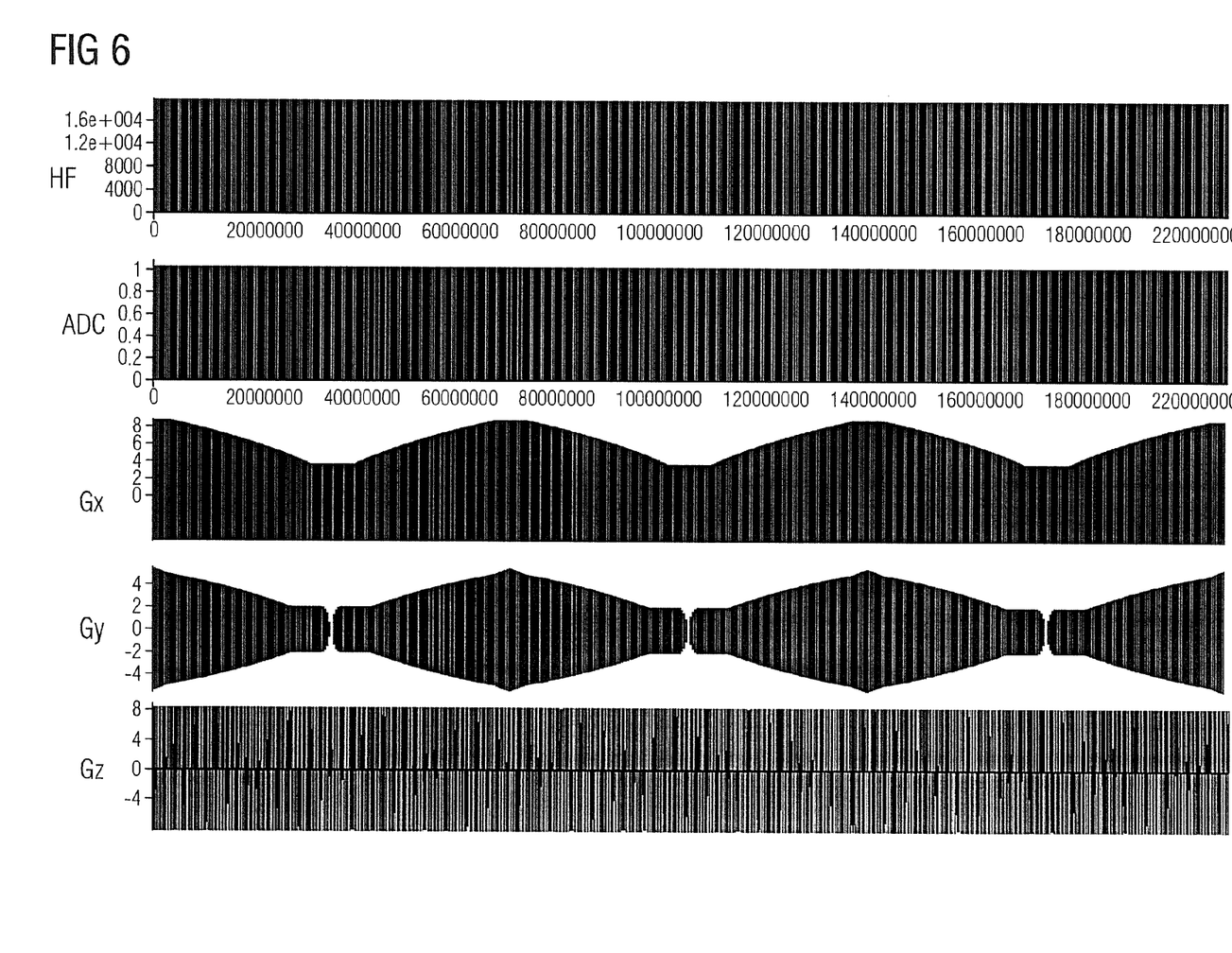
FIG. 6 shows the gradient waveform for a complete measurement of the two-dimensional k-space.

FIG. 6 shows the gradient waveform for the complete measurement, wherein the k-space 40 is acquired twice. The analogy to FIG. 4 is apparent in particular from the curve of the readout gradient Gx. In those time periods in which the readout gradient Gx is at its maximum value, the k-space lines at the upper or lower periphery of the k-space 40 are sampled in which the MR data of each point of the k-space line is acquired. In those time periods in which the readout gradient Gx is at its minimum value, the k-space lines in the central region 44 are acquired in which the dephasing gradient 38, and consequently the readout gradient 33, is switched for the shortest time.

Figure 7:
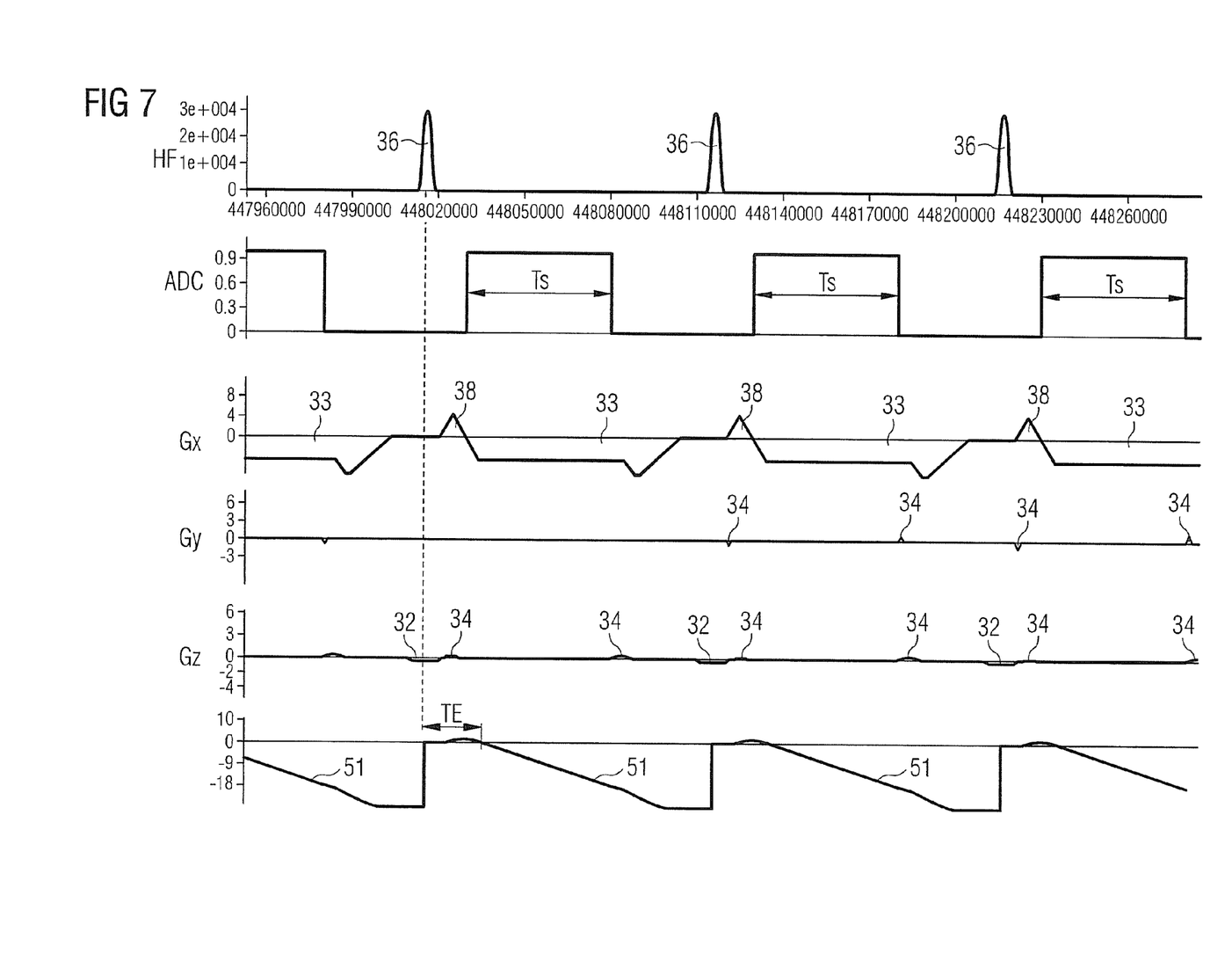
FIG. 7 shows a three-dimensional gradient echo sequence according to the invention.

FIG. 7 shows the gradient waveform for a three-dimensional acquisition of MR data in the case of a gradient echo sequence according to the invention.

In contrast to the gradient echo sequence shown in FIG. 5, the RF excitation pulse 36 in FIG. 7 is a symmetric pulse. The temporal start of the echo time TE therefore coincides with the center of the time interval in which the RF excitation pulse 36 is applied. Simultaneously with the RF excitation pulse 36, a slice selection gradient 32 is switched which is considerably smaller in comparison with FIG. 5, since no slice, but the entire volume segment is excited. Because a three-dimensional data acquisition is involved, two phase encoding gradients 34, or more specifically Gy, Gz, are switched.

The gradient moment 51 for the gradient Gx is shown at the bottom in FIG. 7. The gradient echo is generated at the time point at which the gradient moment 51 intersects the 0 line, said time point also marking the end of the echo time TE.

Figure 8:
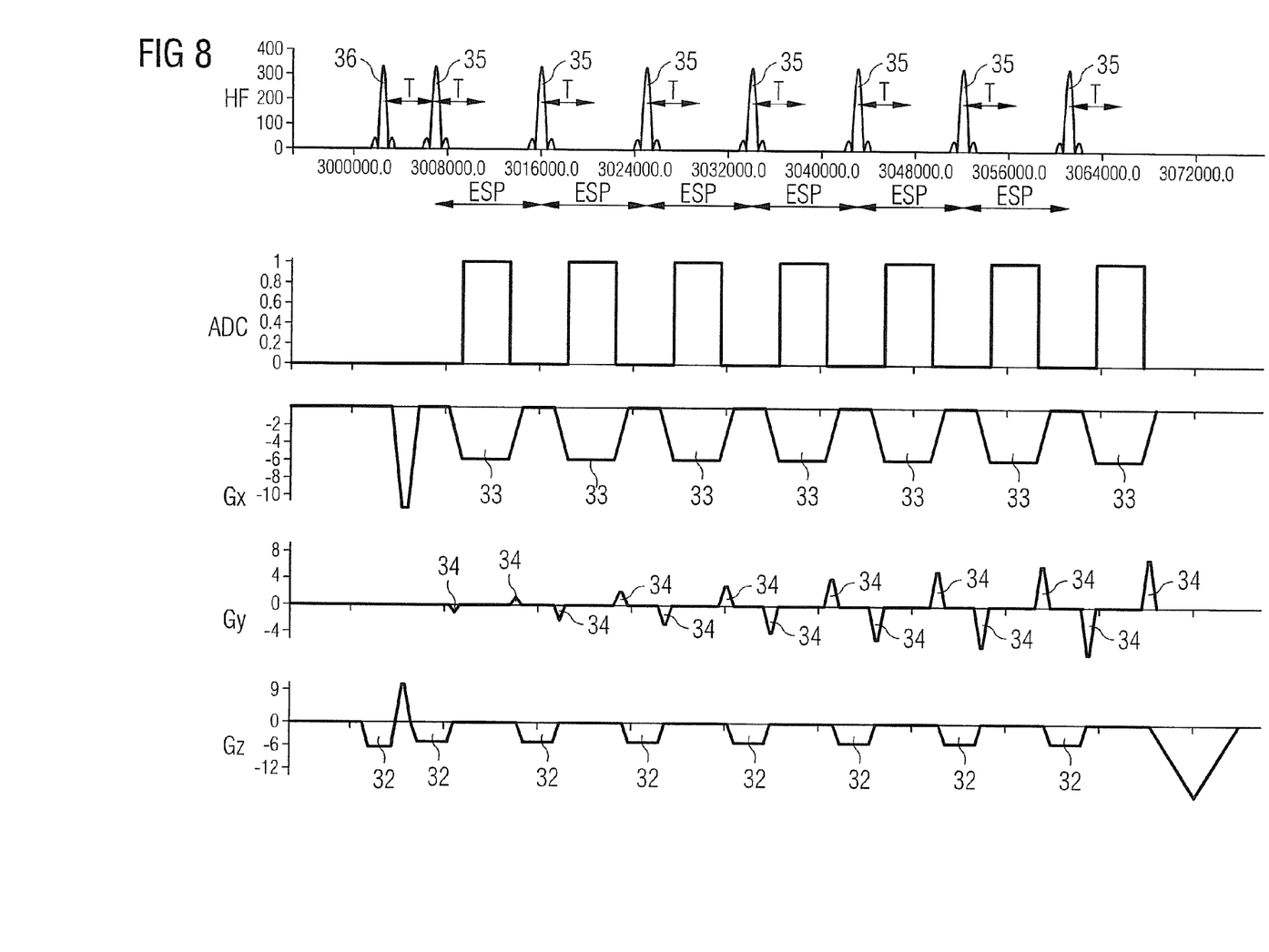
FIG. 8 shows a two-dimensional turbo spin-echo sequence according to the invention without crusher gradients.

FIG. 8 shows a turbo spin-echo sequence according to the invention.

After an RF excitation pulse 36 (a 90° pulse) which is switched simultaneously with a slice selection gradient 32, an RF refocusing pulse 35 (a 180° pulse) is applied simultaneously with a further slice selection gradient 32. Because the refocusing pulse 35 allows the spins dephasing since the RF excitation pulse 36 to rephase again, the spin echo occurs a time interval T after the refocusing pulse 35, said time interval T also defining the time gap between the RF excitation pulse 36 and the following refocusing pulse 35. The measurement time shown above the line ADC has its temporal center exactly at the time point of the spin echo.

According to the invention, the time interval T, which starts at the maximum value of the refocusing pulse 35 and ends with the spin echo, is chosen shorter for k-space lines inside the central region than for k-space lines outside of the central region. In this case the time interval T corresponds to half of the echo spacing ESP, which defines the distance between two spin echoes succeeding one another in time, as well as the distance between two refocusing pulses 35 succeeding one another in time.

In order to read out each k-space line, the phase encoding gradient 34 must be switched after the refocusing pulse 35, before the MR data of the respective k-space line is acquired while readout gradient 33 is switched. In this case the measurement time ADC starts only when the readout gradient 33 has reached its maximum value.

Figure 9:
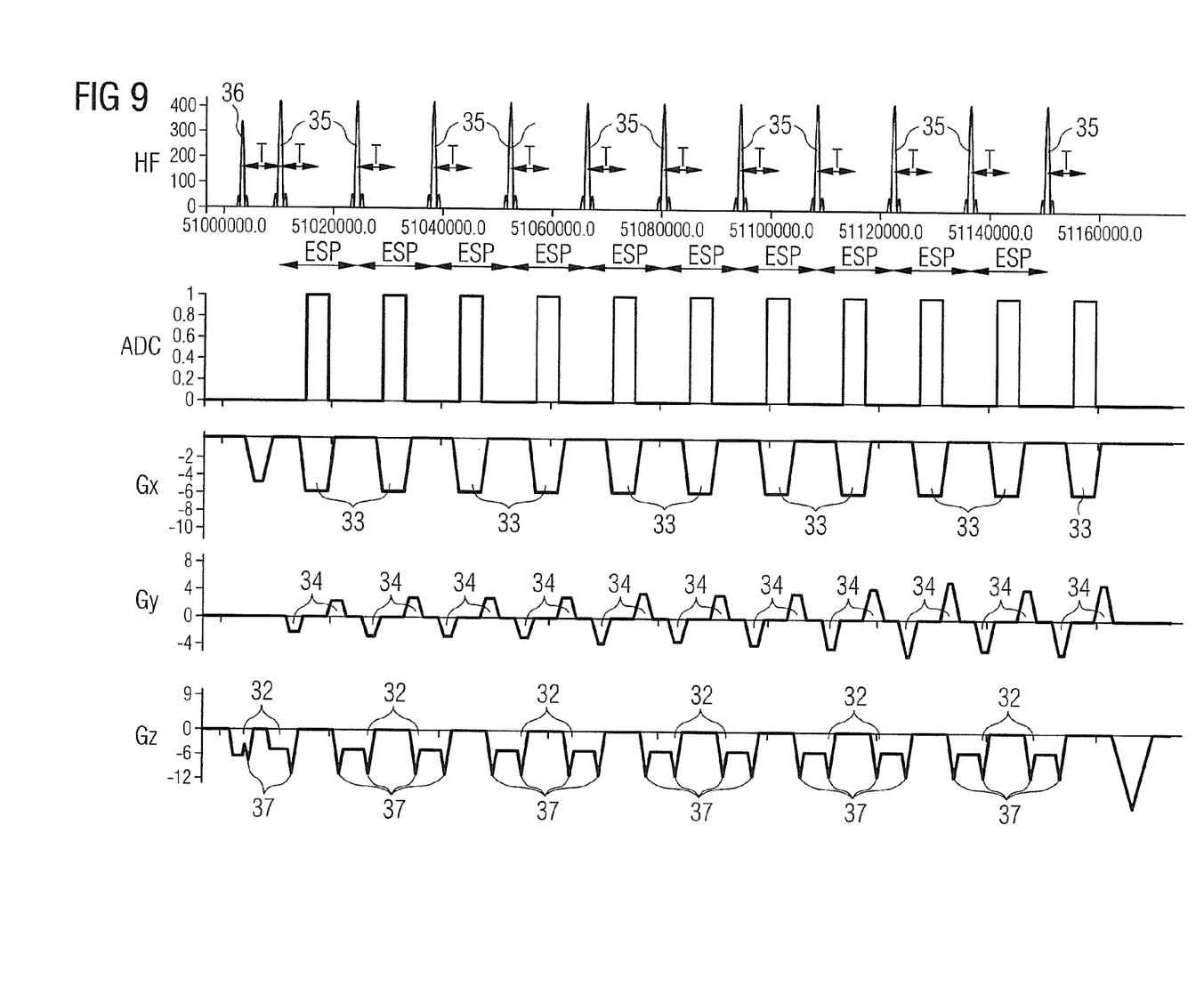
FIG. 9 shows a two-dimensional turbo spin-echo sequence according to the invention.

FIG. 9 shows a further turbo spin-echo sequence according to the invention.

In contrast to FIG. 8, in the sequence depicted in FIG. 9, crusher gradients 37 are switched before or, as the case may be, after the slice selection gradient 32 for the refocusing pulses 35.

It should be pointed out that MR data can be acquired already during the rise of the readout gradient 33, which is referred to as ramp sampling.

Figure 10:
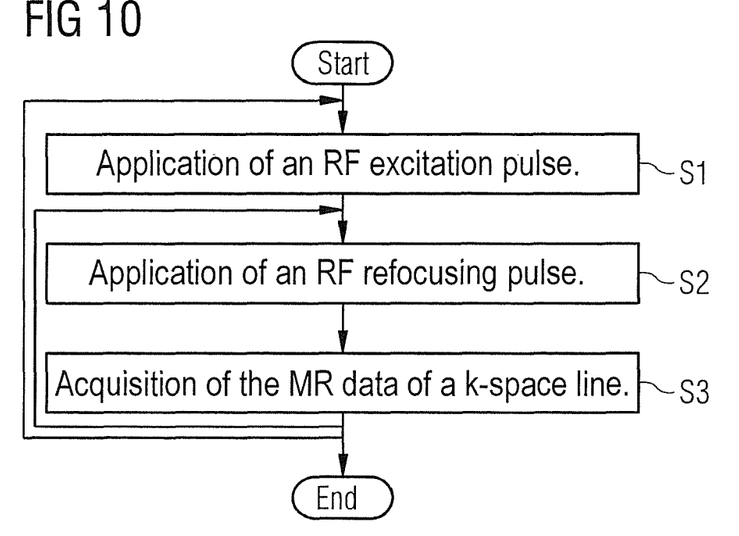
FIG. 10 is a flowchart of a turbo spin-echo sequence according to the invention.

To provide an overview, FIG. 10 schematically depicts a flowchart for acquiring the MR data in k-space by means of a turbo spin-echo sequence according to the invention.

After the RF excitation pulse is applied in step S1, an RF refocusing pulse is applied in the following step S2, before the MR data of a k-space line is subsequently acquired in step S3. Thereafter, steps S2 and S3 are repeated in order, starting from the same RF excitation pulse, to acquire further k-space lines in the course of an echo train. When all of the k-space lines of the echo train have been acquired, a new echo train starts in that a further RF excitation pulse is applied in step S1 and in the course of the further echo train further RF refocusing pulses are applied in step S2 in order to acquire one k-space line in each case in the following step S3. The sequence ends when the MR data of all of the k-space lines of k-space has been acquired.

Figure 11:
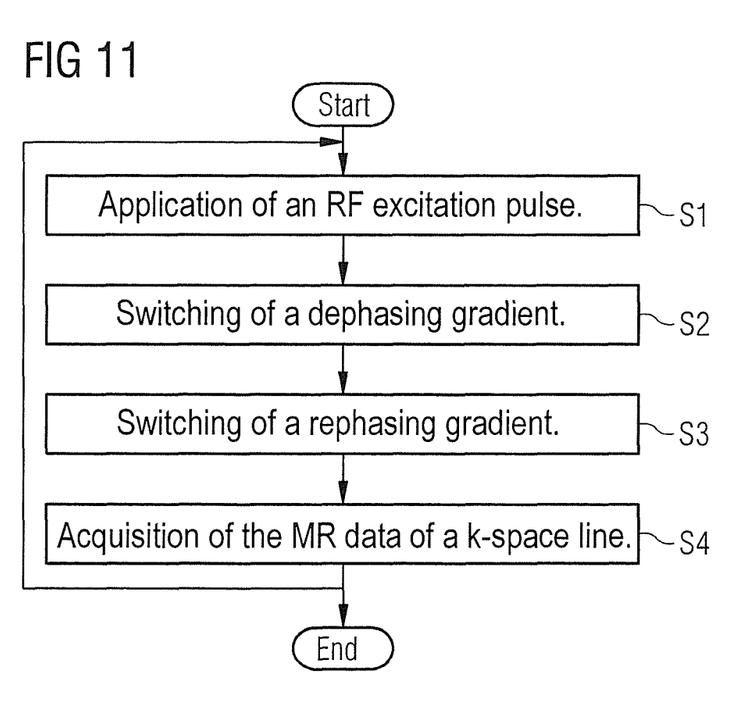
FIG. 11 is a flowchart of a gradient echo sequence according to the invention.

In an analogous manner, FIG. 11 schematically depicts a flowchart for acquiring the MR data in k-space by a gradient echo sequence according to the invention.

In this case, an RF excitation pulse is applied in step S1 for each k-space line that is to be acquired, a dephasing gradient subsequently being switched in step S2, followed by a rephasing gradient in step S3, before the MR data of the respective k-space line is acquired in step S4.

Although modifications and changes may be suggested by those skilled in the art, it is the intention of the inventors to embody within the patent warranted hereon all changes and modifications as reasonably and properly come within the scope of their contribution to the art.

I claim as my invention:

1. A method for acquiring magnetic resonance (MR) data, comprising:

from a control computer, operating an MR scanner, while an examination subject is situated in the MR scanner, according to a data acquisition sequence that includes radiating a radiofrequency (RF) excitation pulse that excites nuclear spins in a predetermined volume of the examination subject;

from said control computer, operating said MR scanner according to said data acquisition sequence to acquire MR data originating from the excited nuclear spins;

from said control computer, entering the acquired MR data into an electronic memory organized as k-space, which corresponds to said predetermined volume, in a plurality of parallel k-space lines in k-space;

in said control computer, setting a time period in said data acquisition sequence for each of said parallel k-space lines, said time period starting from radiation of the RF excitation pulse immediately preceding acquisition of data for a respective k-space line and ending at a time of an echo signal, produced by the excited nuclear spins, during which MR data for the respective k-space line are acquired;

in said control computer, setting said time period to be shorter for k-space lines situated in a central region of k-space compared to k-space lines outside of said central region; and from said control computer, making the MR data entered into said electronic memory available in electronic form, as a data file.

2. A method as claimed in claim 1 comprising:

from said control computer, operating said MR scanner in said data acquisition sequence to radiate a refocusing pulse prior to acquisition of MR data from each k-space line; and using said refocusing pulse that is applied immediately before acquisition of said MR data from a respective k-space line as the RF excitation pulse that defines said start of said time period for that respective k-space line.

3. A method as claimed in claim 2 comprising, from said control computer, operating said MR scanner to acquire MR data from said k-space lines in said central region twice, and in the two acquisitions of said MR data for each of said k-space lines in said central region, respectively radiating refocusing pulses with phase cycles that are opposite to each other and thereby computationally eliminating sources of interference.

4. A method as claimed in claim 3 comprising, from said control computer, operating said MR scanner to activate no crusher gradient either immediately before or immediately after said refocusing pulse.

5. A method as claimed in claim 2 comprising, from said control computer, operating said MR scanner in said data acquisition sequence by, starting from a same RF excitation pulse, acquiring MR data for a plurality of said parallel k-space lines in one echo train following said same RF excitation pulse, by radiating said RF refocusing pulse prior to acquisition of said MR data from each of said parallel k-space lines, within echo spacing between two successive refocusing pulses in the same echo train being constant, and setting said echo spacing to be shorter when said echo train comprises MR data for k-space lines in said central region of k-space compared to the echo spacing for acquisition of said MR data from k-space lines outside of said central region.

6. A method as claimed in claim 1 comprising:
from said control computer, operating said MR scanner to activate a dephasing gradient and a rephasing gradient prior to acquisition of said MR data from each k-space line; and
using said RF excitation pulse as the RF pulse that defines said start of said time period.

7. A method as claimed in claim 6 comprising:
from said control computer, operating said MR scanner to radiate said RF excitation pulse as a half pulse for acquisition of said MR data for said parallel k-space lines in said central region of k-space; and
acquiring said MR data for said parallel k-space lines in said central region of k-space twice and in each of the two acquisitions, operating said MR scanner to activate a slice selection gradient, with the respective slice selection gradients in said two measurements being of opposite polarity.

8. A method as claimed in claim 7 comprising activating said slice selection gradient in a slice selection direction, and comprising: from said control computer, operating said MR scanner in said data acquisition sequence with said half pulse and said slice selection gradient being configured to cause no dephasing of said nuclear spins to occur due to said slice selection gradient, thereby avoiding inclusion, in said data acquisition sequence, of a rephasing in said slice selection direction.

9. A method as claimed in claim 6 comprising, from said control computer, operating said MR scanner to acquire said MR data for said parallel k-space lines in said central region of k-space incompletely, by activating said dephasing gradient for a duration that causes only a predetermined number of k-space points, in each of said parallel k-space lines in said central region, to be filled with said MR data before the respective echo for that respective k-space line, said predetermined number being less than half of k-space points of a completely filled k-space line.

10. A method as claimed in claim 9 comprising keeping said predetermined number constant for all parallel k-space lines in said central region of k-space.

11. A method as claimed in claim 9 comprising, from said control computer, operating said MR scanner to activate said dephasing gradient in a first time interval, and to activate a phase encoding gradient in a second time interval, and setting said first time interval to be no longer than said second time interval.

12. A method as claimed in claim 6 comprising, from said control computer, operating said MR scanner to acquire said MR data from said parallel k-space lines in said central region of k-space with a bandwidth that is below a predetermined threshold value.

13. A method as claimed in claim 6 comprising, from said control computer, operating said MR scanner to execute said data acquisition sequence with a repetition time that is constant for all k-space lines in k-space.

14. A method as claimed in claim 6 comprising, from said control computer, operating said MR scanner to radiate said RF excitation pulse as an asymmetric pulse.

15. A method as claimed in claim 1 comprising, from said control computer, acquiring said MR data from a plurality of slices in said volume segment one slice at a time.

16. A method as claimed in claim 1 comprising, from said control computer, operating said MR scanner to acquire said MR data from said volume segment three-dimensionally.

17. A method as claimed in claim 1 wherein said MR scanner comprises a plurality of RF reception antennas and, from said control computer, operating said MR scanner in said data acquisition sequence to acquire said MR data concurrently with said plurality of RF reception antennas.

18. A method as claimed in claim 1 wherein said MR scanner comprises a gradient coil system that activates magnetic field gradients with a maximum slew rate imposed on said gradients, and comprising, from said control computer, operating said MR scanner in said data acquisition sequence to activate at least one gradient magnetic field with said gradient coil system having a slew rate that does not exceed a predetermined percentage of said maximum slew rate.

19. A magnetic resonance (MR) apparatus comprising:
an MR scanner comprising a radio-frequency (RF) antenna;
a control computer configured to operate said MR scanner, while an examination subject is situated in the MR scanner, according to a data acquisition sequence that includes radiating an RF excitation pulse from said RF antenna that excites nuclear spins in a predetermined volume of the examination subject;
said control computer being configured to operate said MR scanner according to said data acquisition sequence to acquire MR data originating from the excited nuclear spins;
an electronic memory organized as k-space that corresponds to said predetermined volume;
said control computer being configured to enter the acquired MR data into said electronic memory in a plurality of parallel k-space lines in k-space;
said control computer being configured to set a time period in said data acquisition sequence for each of said parallel k-space lines, said time period starting from radiation of the RF excitation pulse immediately preceding acquisition of data for a respective k-space line and ending at a time of an echo signal, produced by the excited nuclear spins, during which MR data for the respective k-space line are acquired;
said control computer being configured to set said time period to be shorter for k-space lines situated in a central region of k-space compared to k-space lines outside of said central region; and said control computer being configured to make the MR data entered into said electronic memory available in electronic form, as a data file.

20. A non-transitory, computer-readable data storage medium encoded with programming instructions, said storage medium being loaded into a control computer of a magnetic resonance (MR) apparatus that comprises an MR scanner having a radio-frequency (RF) antenna, said programming instructions causing said control computer to:

operate said MR scanner, while an examination subject is situated in the MR scanner, according to a data acquisition sequence that includes radiating an RF excitation pulse from said RF antenna that excites nuclear spins in a predetermined volume of the examination subject;

operate said MR scanner according to said data acquisition sequence to acquire MR data originating from the excited nuclear spins;

enter the acquired MR data into an electronic memory organized as k-space, which corresponds to said predetermined volume, in a plurality of parallel k-space lines in k-space;

set a time period in said data acquisition sequence for each of said parallel k-space lines, said time period starting from radiation of the RF excitation pulse immediately preceding acquisition of data for a respective k-space line and ending at a time of an echo signal, produced by the excited nuclear spins, during which MR data for the respective k-space line are acquired;

set said time period to be shorter for k-space lines situated in a central region of k-space compared to k-space lines outside of said central region; and make the MR data entered into said electronic memory available in electronic form, as a data file.

* * * * *